(12) United States Patent
Aipperspach et al.

(10) Patent No.: US 7,689,950 B2
(45) Date of Patent: Mar. 30, 2010

(54) IMPLEMENTING EFUSE SENSE AMPLIFIER TESTING WITHOUT BLOWING THE EFUSE

(75) Inventors: Anthony Gus Aipperspach, Rochester, MN (US); David Howard Allen, Rochester, MN (US); Louis Bernard Bushard, Rochester, MN (US); Phil Christopher Felice Paone, Rochester, MN (US); Gregory John Uhlmann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 121 days.

(21) Appl. No.: 11/872,763

(22) Filed: Oct. 16, 2007

(65) Prior Publication Data

US 2008/0169843 A1 Jul. 17, 2008

Related U.S. Application Data

(63) Continuation-in-part of application No. 11/622,519, filed on Jan. 12, 2007, now Pat. No. 7,489,572.

(51) Int. Cl.
G06F 17/50 (2006.01)
(52) U.S. Cl. .......................................... 716/4
(58) Field of Classification Search ........................ 716/4
See application file for complete search history.

(56) References Cited

U.S. PATENT DOCUMENTS

| 2003/0125925 | A1* | 7/2003 | Walther et al. ................. 703/22 |
| 2007/0157140 | A1* | 7/2007 | Holesovsky et al. ........... 716/5 |
| 2007/0159231 | A1* | 7/2007 | Lin et al. ..................... 327/525 |
| 2007/0230079 | A1* | 10/2007 | Ashizawa .................... 361/104 |
| 2008/0106323 | A1* | 5/2008 | Aipperspach et al. ....... 327/525 |

\* cited by examiner

*Primary Examiner*—Jack Chiang
*Assistant Examiner*—Suresh Memula
(74) *Attorney, Agent, or Firm*—Joan Pennington

(57) ABSTRACT

A method and apparatus implement effective testing of a sense amplifier for an eFuse without having to program or blow the eFuse, and a design structure on which the subject circuit resides is provided. After initial processing of the sense amplifier, testing determines whether the sense amplifier can generate a valid "0" and "1" before programming the eFuse. A first precharge device and a second precharge device that normally respectively precharge a true sense node and a complement sense node to a high voltage are driven separately. For testing, one of the precharge devices is conditionally held off to insure the sense amplifier results in a "0" and "1". This allows the testing of the sense amplifier devices as well as down stream connected devices. Once testing is complete, both precharge devices are controlled in tandem.

12 Claims, 6 Drawing Sheets

IMPLEMENTING EFUSE SENSE AMPLIFIER TESTING WITHOUT BLOWING THE EFUSE

This application is a continuation-in-part application of Ser. No. 11/622,519 filed on Jan. 12, 2007.

FIELD OF THE INVENTION

The present invention relates generally to the data processing field, and more particularly, relates to a method and apparatus for implementing effective testing of a sense amplifier of an eFuse without having to blow the eFuse, and a design structure on which the subject circuit resides.

DESCRIPTION OF THE RELATED ART

In known testing arrangements for testing of a sense amplifier of an eFuse, multiple transistors defining the sense amplifier are only tested in the unblown state. If the chip is to be sent to a customer before the eFuses are blown there is no way to know if the sense amplifier will operate properly when the eFuse is blown.

Typically this lack of effective testing results in a low field-programming yield due to untested faults inside the sense amplifier and surrounding circuits. This yield loss could be avoided if the sense amplifier could be tested without having to blow the eFuse. Typically the transistors that are only tested in one state will have, for example, over half of their faults untested when leaving manufacturing.

A need exists for a mechanism for effectively testing of a sense amplifier of an eFuse without having to blow the fuse. It is highly desirable to provide such mechanism that does not require additional devices in the sense amplifier.

As used in the following description and claims, it should be understood that the term eFuse means a non-volatile storage element that includes either an antifuse, which is a programmable element that provides an initial high resistance and when blown provides a selective low resistance or short circuit; or a fuse, which is a programmable element that provides an initial low resistance and when blown provides a selective high resistance or open circuit.

SUMMARY OF THE INVENTION

Principal aspects of the present invention are to provide a method and apparatus for implementing effective testing of a sense amplifier of an eFuse without having to blow the eFuse, and a design structure on which the subject circuit resides. Other important aspects of the present invention are to provide such method and apparatus for implementing effective testing of a sense amplifier of an eFuse without having to blow the eFuse substantially without negative effect and that overcome many of the disadvantages of prior art arrangements.

In brief, a method and apparatus for implementing effective testing of a sense amplifier for an eFuse without having to program or blow the eFuse, and a design structure on which the subject circuit resides are provided. After initial processing of the sense amplifier, testing determines whether the sense amplifier can generate both output states (valid "0" and "1" outputs) resulting from an unblown and a blown eFuse before programming the eFuse. A first precharge device and a second precharge device respectively normally precharging a true sense node and a complement sense node of the sense amplifier to a high voltage are driven separately during testing. For testing, the precharge devices are selectively controlled to insure the sense amplifier results in both output states. This enables testing of devices defining the sense amplifier as well as down stream connected devices. Once testing is complete, both precharge devices are controlled in tandem.

In accordance with features of the invention, test coverage of the sense amplifier is increased by splitting the precharge (PC) signal into two physically different signals. This allows the tester to set the sense amplifier and connected into the same output state ("1" output) that occurs when the eFuse is actually blown without having to blow the eFuse. This testing of the invention significantly improves field-programming yield.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, the sense amplifier of an eFuse is effectively tested without having to blow the eFuse. Electronic fuses or eFuses use a sense amplifier to determine if the eFuse is a logical "0" or logical "1". The fuse stores information by electrically changing the resistance of a polysilicon resistor. The testing of the present invention effectively tests the states of the sense amplifier that result from both the blown and not blown conditions of the eFuse.

Figure 1:
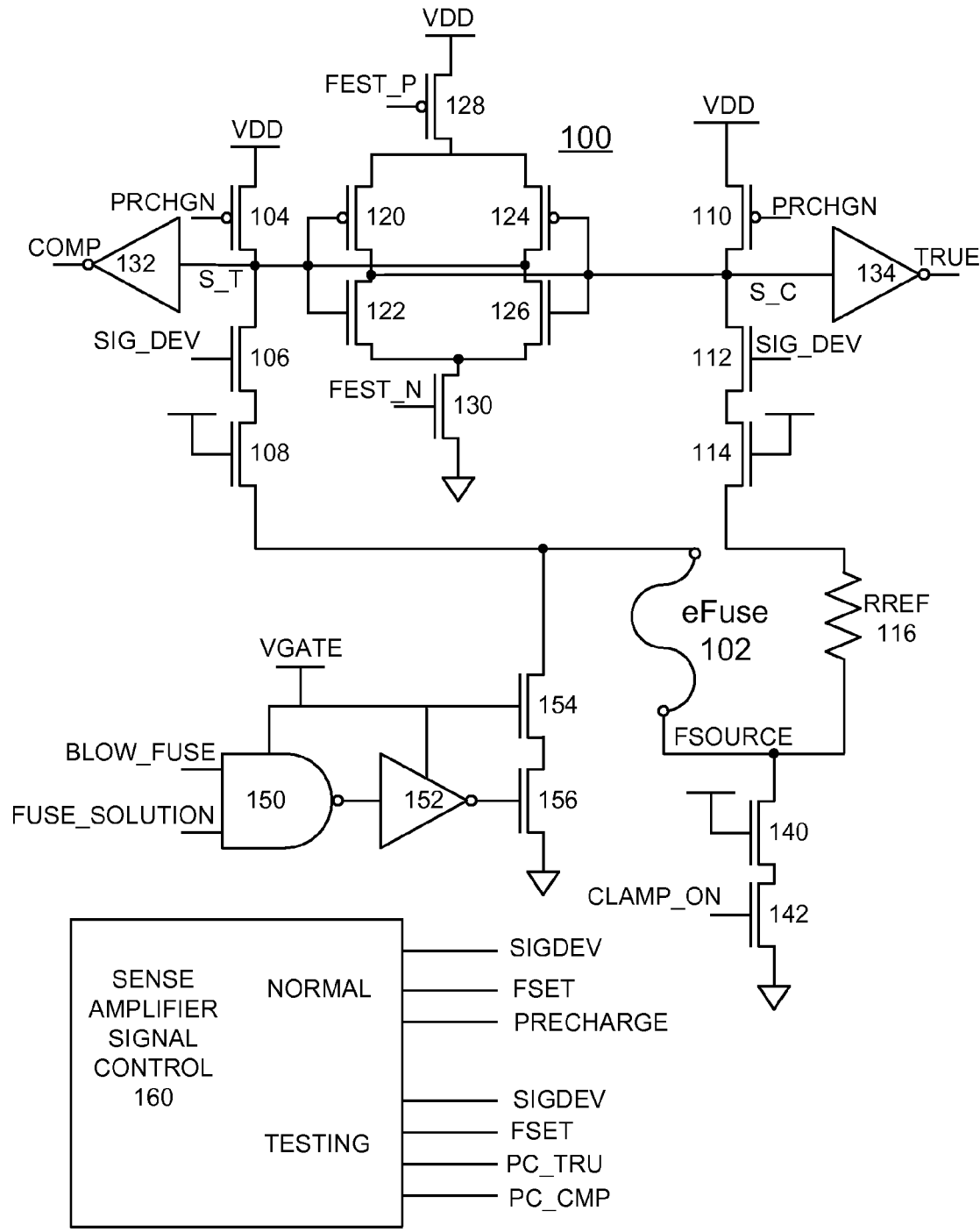
FIG. 1 is a schematic diagram illustrating an exemplary sense amplifier for implementing eFuse sense amplifier testing in accordance with the preferred embodiment.

Having reference now to the drawings, in FIG. 1, there is shown an exemplary sense amplifier generally designated by the reference character 100 for implementing eFuse sense amplifier testing in accordance with the preferred embodiment.

Sense amplifier 100 is used for an electronic fuse, or eFuse 102 to determine if the fuse 102 is a logical "0" or logical "1". The fuse 102 stores information by electrically changing the resistance of a polysilicon resistor. Sense amplifier 100 includes true and complement sensing nodes respectively labeled S_T and S_C. A first precharge P-channel field effect transistor (PFET) 104 is connected between a positive voltage supply rail VDD and the true sensing node S_T that is connected via a pair of series connected N-channel field effect transistor (NFETs) 106, 108 to the eFuse 102. A second precharge P-channel field effect transistor (PFET) 110 is connected between the positive voltage supply rail VDD and the complement sensing node S_C that is connected via a pair of series connected N-channel field effect transistor (NFETs) 112, 114 to a reference resistor 116.

Sense amplifier 100 includes a pair of cross-coupled inverters connected to the true and complement sensing nodes S_T and S_C, as shown. A PFET 120 and an NFET 122, and a PFET 124 and an NFET 126 respectively form the cross-coupled inverters. A pull-up PFET 128 connects PFETs 120, 124 to the positive voltage supply rail VDD and a pull-down NFET 130 connects NFETs 122, 126 to ground.

The eFuse 102 and reference resistor 116 are connected to a common node labeled FSOURCE and a connected via a pair of series connected N-channel field effect transistor (NFETs) 140, 142 to ground. A fuse programming circuit coupled to the eFuse 102 includes a NAND gate 150 receiving two inputs, BLOW_FUSE, FUSE_SOLUTION and providing an output applied to an inverter 152, and a pair of series connected N-channel field effect transistor (NFETs) 154, 156 connected between the eFuse 102 to ground.

The reference resistor 116 is, for example, about ½ the difference between a "0" and "1" resistance of fuse 102. The fuse 102 and the reference resistor 116 are used to generate signal for the sense amplifier, that converts them to a digital "0" or "1" value.

Figure 2A:
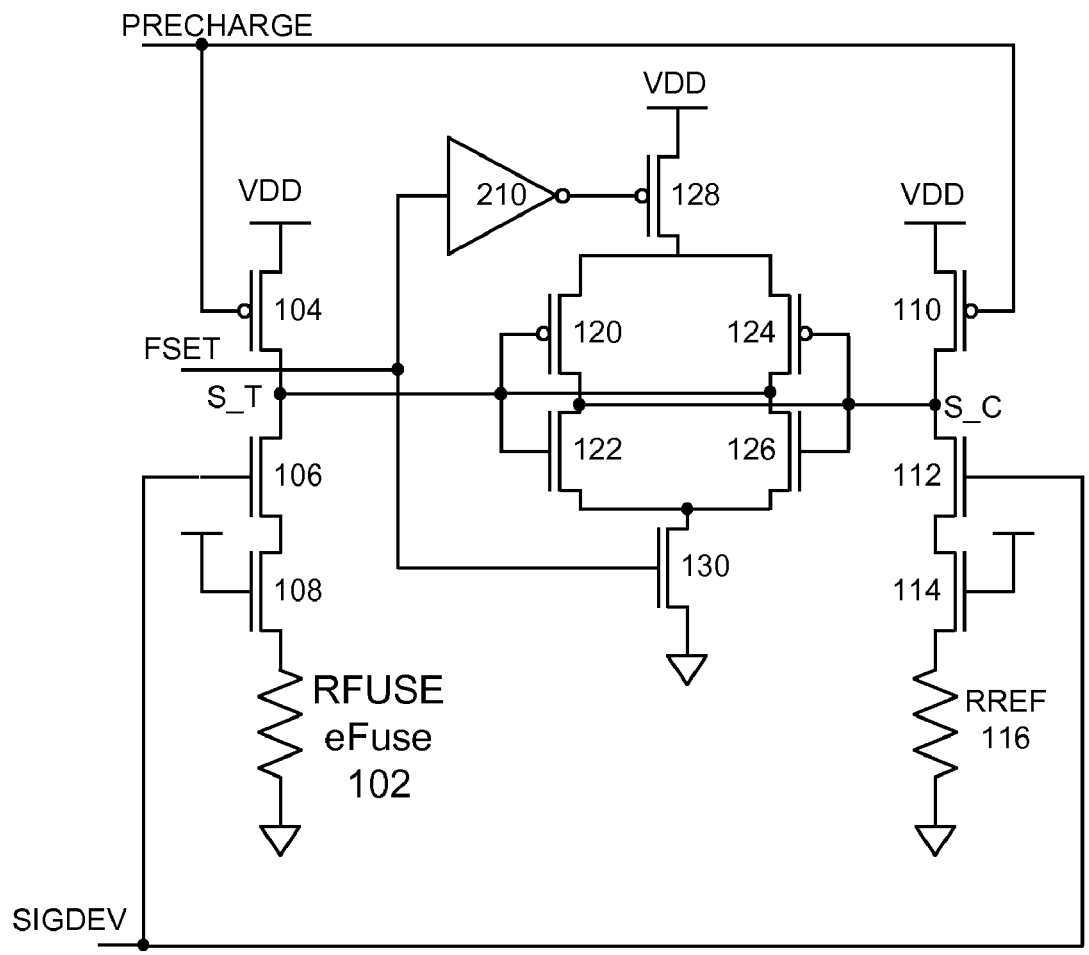
FIGS. 2A and 2B illustrate normal operation of the eFuse sense amplifier of FIG. 1 in accordance with the preferred embodiment.
Figure 2B:
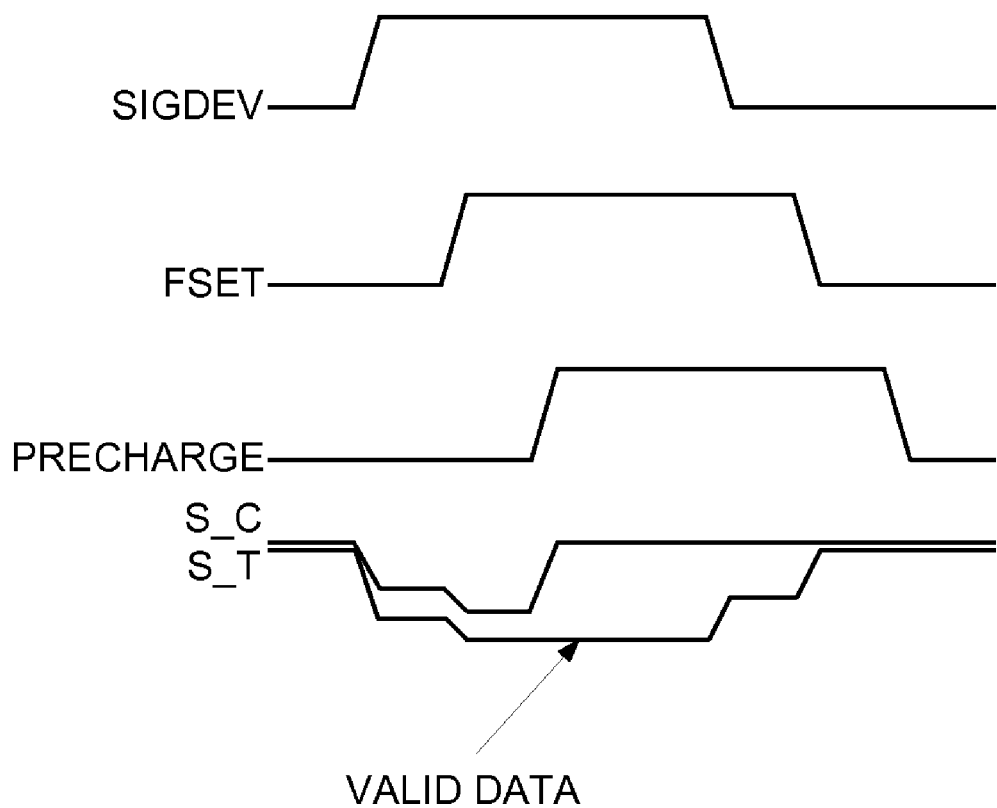
Figure 3A:
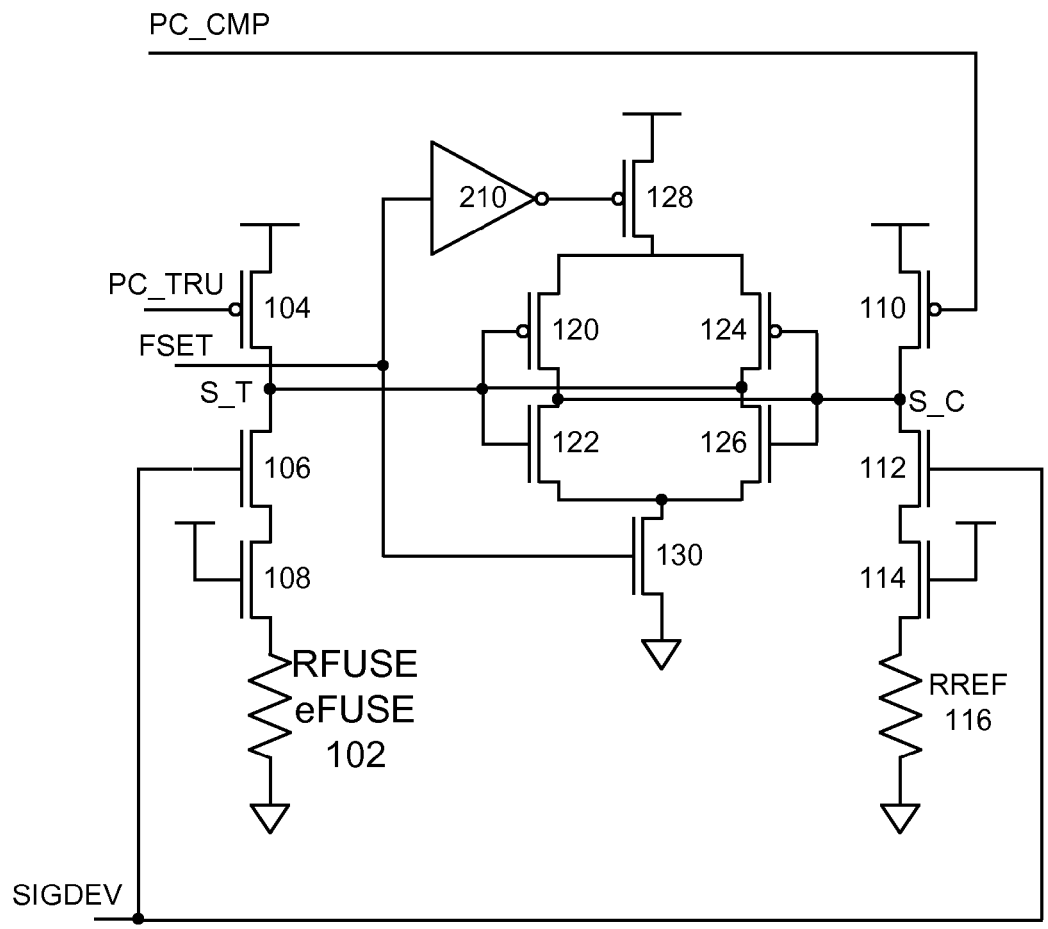
FIGS. 3A and 3B illustrate testing operation of the eFuse sense amplifier of FIG. 1 in accordance with the preferred embodiment.
Figure 3B:
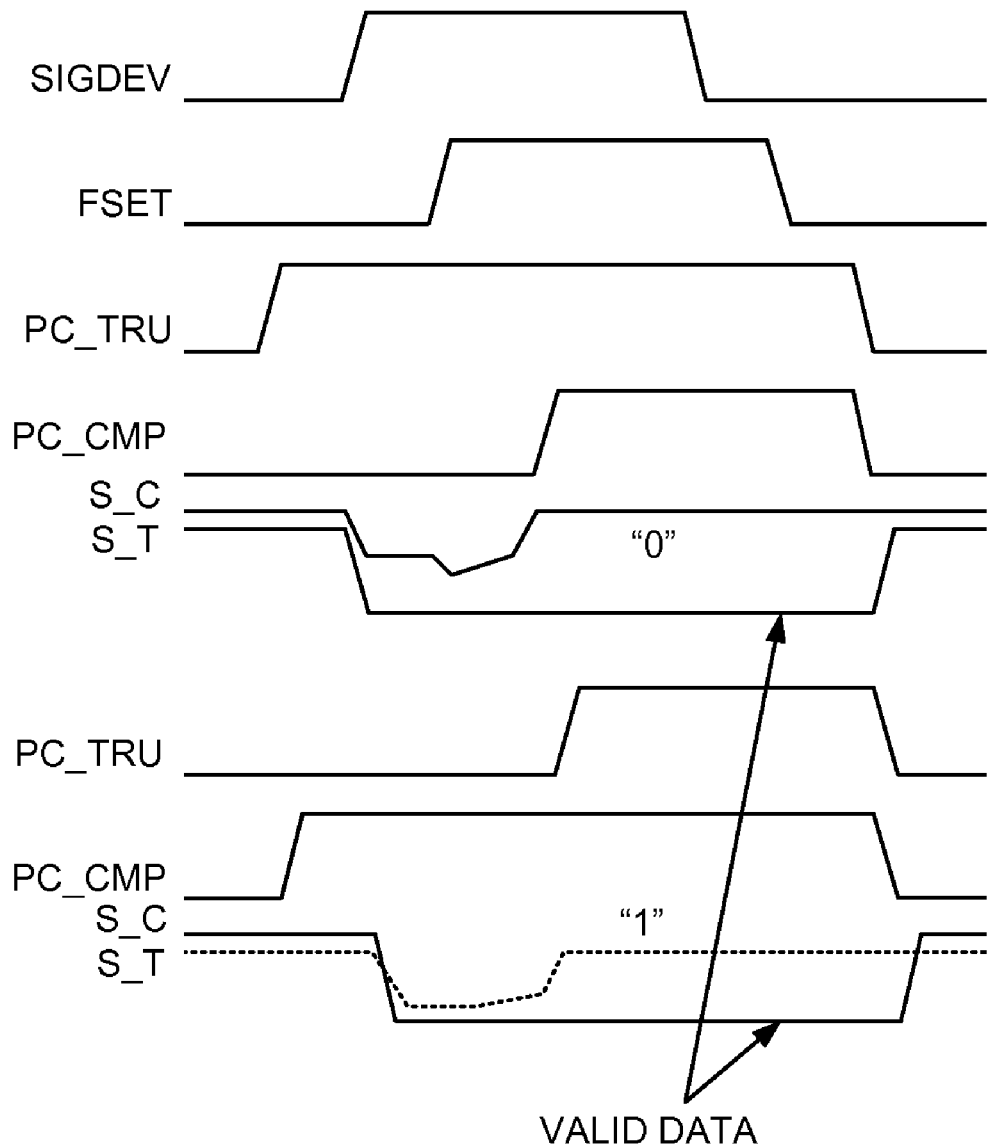

A sense amplifier signal control 160 generates signals SIGDEV, FSET, and PRECHARGE that are applied to the sense amplifier 100 in normal operation as illustrated in FIGS. 2A and 2B. The sense amplifier signal control 160 generates signals SIGDEV, FSET, and two separate precharge control signals PC_TRU, PC_CMP that are applied to the sense amplifier 100 during testing operation as illustrated in FIGS. 3A and 3B in accordance with features of the invention.

Referring to FIGS. 2A and 2B, the sense amplifier 100 initializes by precharging both sides of the sense nodes S_C, S_T to a high voltage with a low PRECHARGE signal applied to both PFETs 104, 110. The FSET signal is inverted by an inverter 210 and applied to PFET 128 and the FSET signal is directly applied to NFET 130. The sensing signals SIGDEV are applied to NFETs 106, 112 on the two sides of the amplifier 100 and the amplification process commences. However, after initial processing of the silicon, it is desirable to test whether the sense amplifier 100 can generate a valid "0" and "1" before blowing or programming the fuse 102. With the eFuse 102 not blown the sense amplifier 100 will result in an output "0" at the output TRUE of inverter 134 of FIG. 1, with S_C high and S_T low, as shown in FIG. 2B.

As shown in FIG. 2B, reading the eFuse 102 includes normal control signals as follows:

1) Initially, PRECHARGE ON, (PFETs 104, 110 turned on) SIGDEV OFF (NFETs 106, 112 turned off), FSET OFF (PFET 128 off, NFET 130 off)

2) SIGDEV ON (NFETs 106, 112 turned on)

3) FSET ON (PFET 128 turned on, NFET 130 turned on)

4) PRECHARGE OFF (PFETs 104, 110 turned off)

5) SIGDEV OFF (data can be read) (NFETs 106, 112 turned off)

6) FSET OFF (PFET 128 off, NFET 130 off)

7) PRECHARGE ON (PFETs 104, 110 turned on)

In accordance with features of the invention, after initial processing of the silicon defining sense amplifier 100, the sense amplifier 100 is tested to determine whether the sense amplifier 100 can generate a valid "0" and "1" outputs before programming or blowing eFuse 102. When the eFuse 102 is not blown the sense amplifier 100 will result in an output "0". When the fuse is blown the sense amplifier 100 will result in an output "1". Testing of the sense amplifier 100 includes both states of the sense amplifier 100 that result from both the blown and not blown conditions of the eFuse 102 without requiring that the eFuse be programmed or blown.

Referring to FIGS. 3A and 3B in accordance with features of the invention testing of the sense amplifier 100 is provided without requiring any additional devices to be added to the sense amplifier. The FSET signal is inverted by an inverter 210 and applied to PFET 128 and the FSET signal is directly applied to NFET 130. The sensing signals SIGDEV are applied to sensing node NFETs 106, 112 on the two sides of the amplifier 100.

As shown in FIG. 3B, the method to read 0 with an unblown fuse 102 is illustrated near the bottom of FIG. 3B, with signal PC_CMP is held low keeping PFET 110 on, and PC_TRU switched off early turning PFET 104 off. Since the eFuse 102 is unblown, the fuse can be read normally as shown in FIG. 2B, however, PC_TRU can be switched off early as shown in FIG. 3B, while it should be understood that this is unnecessary. As shown in FIG. 3B, reading 0 with the unblown eFuse 102 includes testing control signal as follows:

1) Initially, PC_TRU ON, and PC_CMP ON, (PFETs 104, 110 turned on) SIGDEV OFF (NFETs 106, 112 turned off), FSET off (PFET 128 off, NFET 130 off)

2) SIGDEV ON (NFETs 106, 112 turned on)

3) FSET ON (PFET 128 turned on, NFET 130 turned on)

4) PC_TRU OFF, PC_CMP ON (PFET 104 turned on, PFET 110 turned off)

5) SIGDEV OFF (data can be read) (NFETs 106, 112 turned off)

6) FSET OFF (PFET 128 off, NFET 130 off)

7) PC_TRU ON, PC_CMP ON (PFET 104 turned on, PFET 110 turned on)

The method to read 1 with an unblown eFuse 102 is illustrated near the bottom of FIG. 3B starting with signal PC_TRU that is held low keeping PFET 104 on, and PC_CMP switched off early turning PFET 110 off. As shown in FIG. 3B, reading 1 with the unblown eFuse 102 includes testing control signal as follows:

1) Initially, PC_TRU ON, and PC_CMP ON, (both low with PFETs 104, 110 turned on) SIGDEV OFF (NFETs 106, 112 turned off), FSET off (PFET 128 off, NFET 130 off)

2) SIGDEV ON (NFETs 106, 112 turned on)

3) FSET ON (PFET 128 turned on, NFET 130 turned on)

4) PC_TRU ON, PC_CMP OFF (PFET 104 turned on, PFET 110 turned off)

5) SIGDEV OFF (data can be read) (NFETs 106, 112 turned off)

6) FSET OFF (PFET 128 off, NFET 130 off)

7) PC_TRU ON, PC_CMP ON (PFET 104 turned on, PFET 110 turned on)

Figure 4:
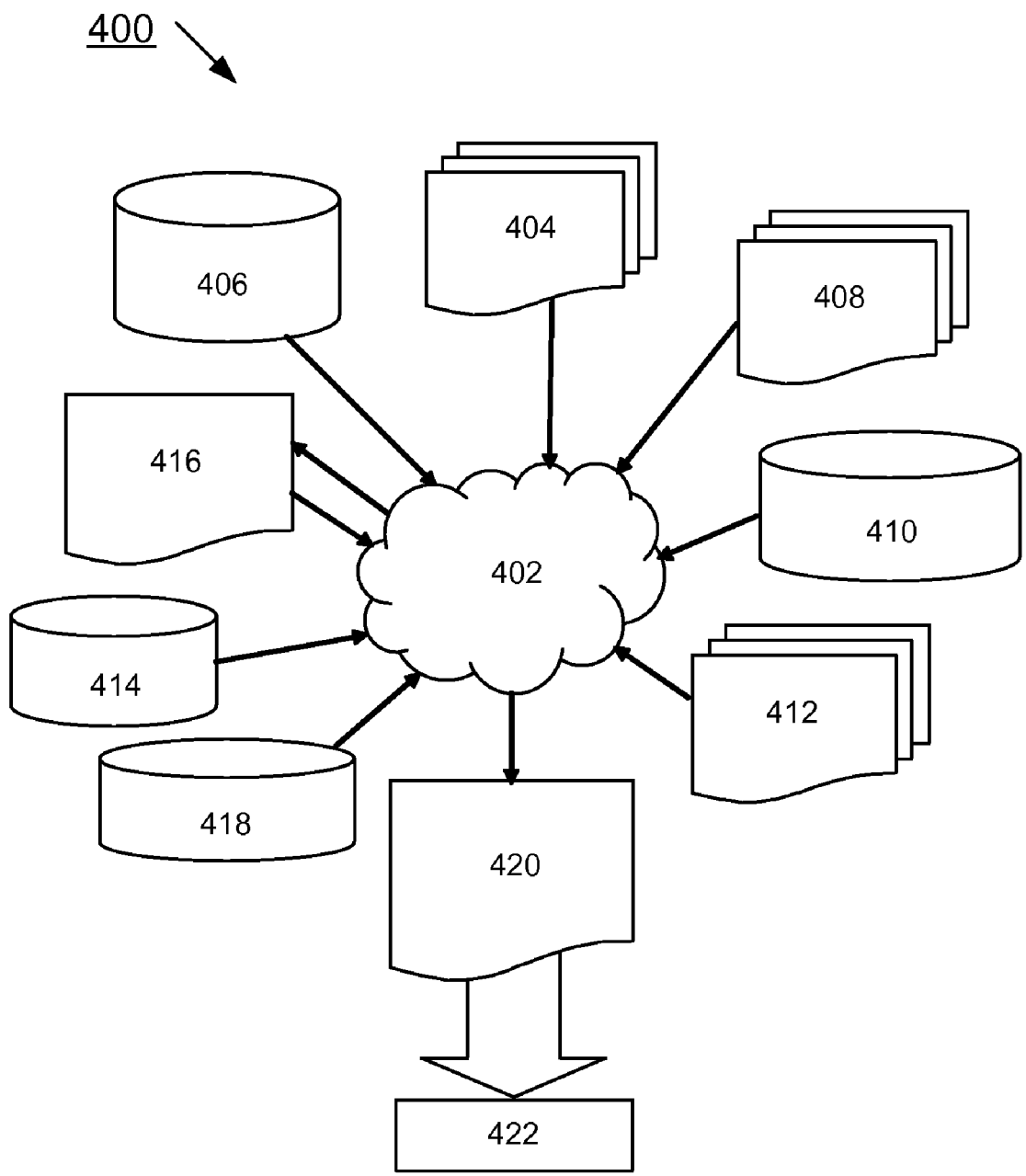
FIG. 4 is a flow diagram of a design process used in semiconductor design, manufacturing, and/or test.

FIG. 4 shows a block diagram of an example design flow 400. Design flow 400 may vary depending on the type of IC being designed. For example, a design flow 400 for building an application specific IC (ASIC) may differ from a design flow 400 for designing a standard component. Design structure 402 is preferably an input to a design process 404 and may come from an IP provider, a core developer, or other design company or may be generated by the operator of the design flow, or from other sources. Design structure 402 comprises circuit 100 in the form of schematics or HDL, a hardware-description language, for example, Verilog, VHDL, C, and the like. Design structure 402 may be contained on one or more machine readable medium. For example, design structure 402 may be a text file or a graphical representation of circuit 100. Design process 404 preferably synthesizes, or translates, circuit 100 into a netlist 406, where netlist 406 is, for example, a list of wires, transistors, logic gates, control circuits, I/O, models, etc. that describes the connections to other elements and circuits in an integrated circuit design and recorded on at least one of machine readable medium. This may be an iterative process in which netlist 406 is resynthesized one or more times depending on design specifications and parameters for the circuit.

Design process 404 may include using a variety of inputs; for example, inputs from library elements 408 which may house a set of commonly used elements, circuits, and devices, including models, layouts, and symbolic representations, for a given manufacturing technology, such as different technology nodes, 32 nm, 45 nm, 90 nm, and the like, design specifications 410, characterization data 412, verification data 414, design rules 416, and test data files 418, which may include test patterns and other testing information.

Design process 404 may further include, for example, standard circuit design processes such as timing analysis, verification, design rule checking, place and route operations, and the like. One of ordinary skill in the art of integrated circuit design can appreciate the extent of possible electronic design automation tools and applications used in design process 404 without deviating from the scope and spirit of the invention. The design structure of the invention is not limited to any specific design flow.

Design process 404 preferably translates an embodiment of the invention as shown in FIGS. 1, 2A and 3A along with any additional integrated circuit design or data (if applicable), into a second design structure 420. Design structure 420 resides on a storage medium in a data format used for the exchange of layout data of integrated circuits, for example, information stored in a GDSII (GDS2), GL1, OASIS, or any other suitable format for storing such design structures. Design structure 420 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1, 2A and 3A. Design structure 420 may then proceed to a stage 422 where, for example, design structure 420 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A design structure tangibly embodied in a computer-readable storage medium for designing, manufacturing, or testing a design, the design structure comprising:
   a testing circuit tangibly embodied in the computer-readable storage medium used in the design process, said testing circuit for testing a sense amplifier for an eFuse to determine whether the sense amplifier can generate a valid "0" and "1" before programming the eFuse; said testing circuit including
   a sense amplifier signal control providing a first precharge signal applied to a first precharge device of the sense amplifier;
   said sense amplifier signal control providing a second precharge signal applied to a second precharge device of the sense amplifier; and
   said sense amplifier signal control selectively controlling said first and second precharge devices for providing a respective output resulting from both an unblown and a blown eFuse of the sense amplifier with the eFuse being unblown, wherein the design structure, when read and used in the manufacture of a semiconductor chip produces a chip comprising said testing circuit.

2. The design structure of claim 1, wherein the design structure comprises a netlist, which describes said testing circuit.

3. The design structure of claim 1, wherein the design structure resides on storage medium as a data format used for the exchange of layout data of integrated circuits.

4. The design structure of claim 1, wherein the design structure includes at least one of test data files, characterization data, verification data, or design specifications.

5. The design structure of claim 1, wherein said first precharge device and said second precharge device respectively precharge a true sense node and a complement sense node of the sense amplifier to a high voltage during normal operation.

6. The design structure of claim 5, wherein said sense amplifier signal control selectively controlling said precharge devices includes said sense amplifier signal control selectively controlling said precharge devices for providing a "0" and "1" output of the sense amplifier with the eFuse being unblown.

7. The design structure of claim 5, wherein said sense amplifier signal control selectively controlling said precharge devices includes said sense amplifier signal control applying sensing control signals to a first control transistor coupled to said first precharge device and a second control transistor coupled to said second precharge device.

8. The design structure of claim 7, wherein the sense amplifier includes a cross-coupled inverter circuit coupled between said true sense node and said complement sense node of the sense amplifier, a first pull-up transistor coupled between said cross-coupled inverter circuit and a voltage supply rail, and a second pull-down transistor coupled to between said cross-coupled inverter circuit and a ground potential; and wherein said sense amplifier signal control selectively controlling said precharge devices includes said sense amplifier signal control applying sensing control signals to said first pull-up transistor and said second pull-down transistor.

9. The design structure of claim 8, wherein said pull-up transistor includes a P-channel field effect transistor and said pull-down transistor includes an N-channel field effect transistor.

10. The design structure of claim 5, wherein said first precharge device and said second precharge device include a respective P-channel field effect transistor.

11. The design structure of claim 5, wherein the eFuse coupled to said true sense node.

12. The design structure of claim 5 includes a reference resistor coupled to said complement sense node.

* * * * *